United States Patent [19]

Ono et al.

[11] Patent Number: 4,866,271
[45] Date of Patent: Sep. 12, 1989

[54] RELATIVE DISPLACEMENT CONTROL APPARATUS

[75] Inventors: Masatoshi Ono; Wataru Mizutani; Hiroshi Murakami; Hiroshi Bando, all of Ibaraki; Shigeru Wakiyama, Tokyo; Fumiki Sakai, Tokyo; Takashi Wakatsuki, Tokyo, all of Japan

[73] Assignees: Agency of Industrial Science and Technology; Seiko Instruments Inc., both of Tokyo, Japan

[21] Appl. No.: 71,994

[22] Filed: Jul. 10, 1987

[30] Foreign Application Priority Data

Jul. 11, 1986 [JP] Japan ............................. 61-164145
Jul. 11, 1986 [JP] Japan ............................. 61-164146
Dec. 4, 1986 [JP] Japan ............................. 61-289157

[51] Int. Cl.$^4$ ............................................ H01J 37/26
[52] U.S. Cl. ................................. 250/306; 250/442.1
[58] Field of Search ................... 250/306, 307, 423 F, 250/440.1, 442.1

[56] References Cited

U.S. PATENT DOCUMENTS

| 4,343,993 | 8/1982 | Binnig et al. ............... 250/306 |
| 4,665,313 | 5/1987 | Wells ............................ 250/306 |
| 4,668,865 | 5/1987 | Gimzewski et al. ......... 250/306 |
| 4,698,502 | 10/1987 | Bedmorz et al. ........... 250/306 |
| 4,724,318 | 2/1988 | Binnig ........................ 250/307 |

OTHER PUBLICATIONS

"Scanning Tunneling Microscope with Micrometer Approach and Thermal Compensation", Jericho et al., Rev. Sci. Inst., vol. 58, No. 8, 8-87.

Primary Examiner—Bruce C. Anderson
Attorney, Agent, or Firm—Bruce L. Adams; Van C. Wilks

[57] ABSTRACT

A relative displacement control apparatus provides both coarse and extremely fine precise control over displacements between a sample and a detecting probe as required, e.g. in operations of optical instruments, analyzing instruments and scanning tunneling microscopes. This precise fine displacement is produced through a double-lever-action which is created substantially by means of an arm assembly preferably with a piezoelectric drive for precise displacement control, a support pivotally holding the arm assembly, a rigid arm fixed solidly atop the support and a pointed stop or "foot" fixed in the proximity of the free end of the rigid arm.

12 Claims, 6 Drawing Sheets

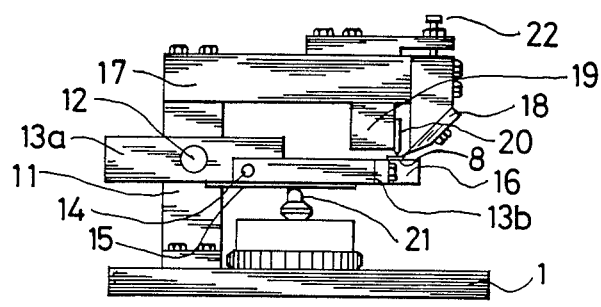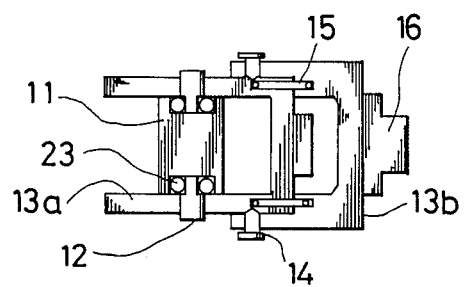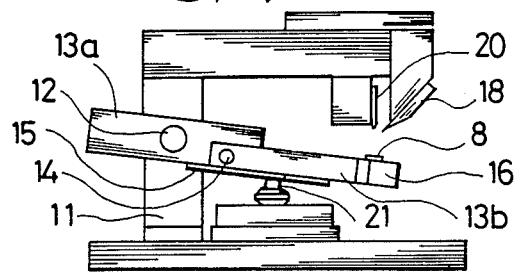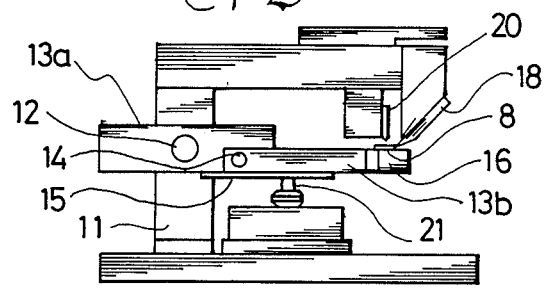

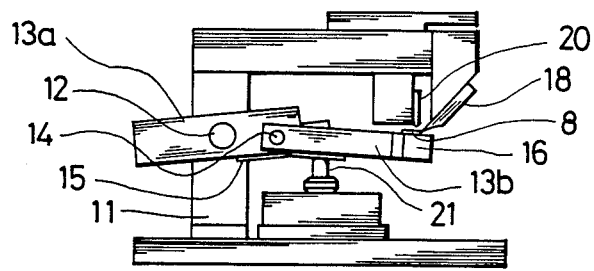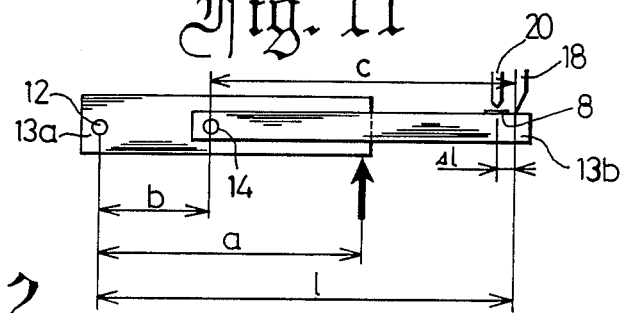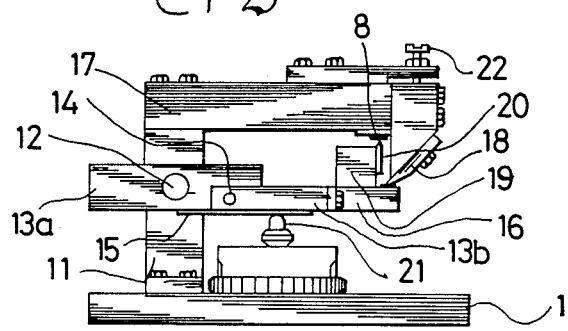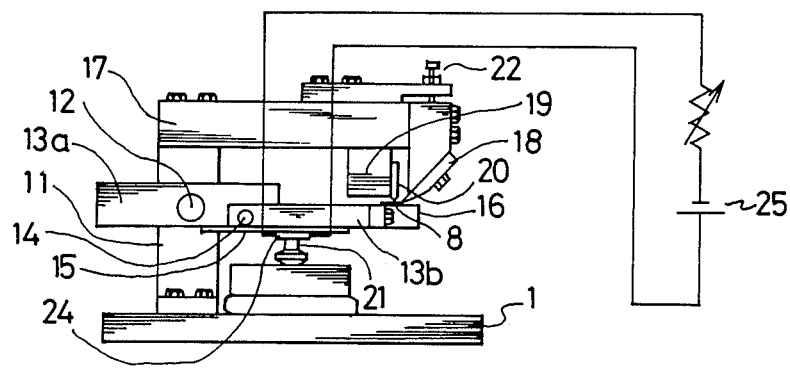

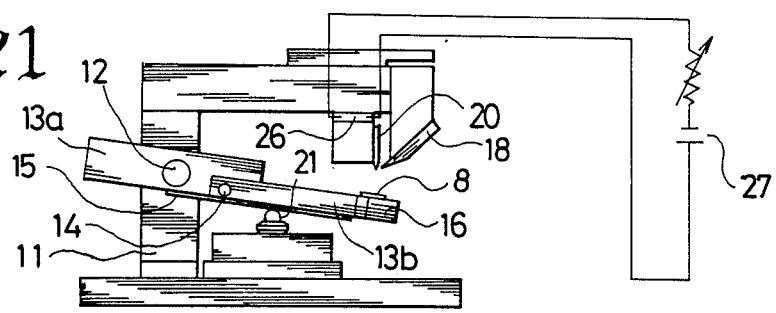
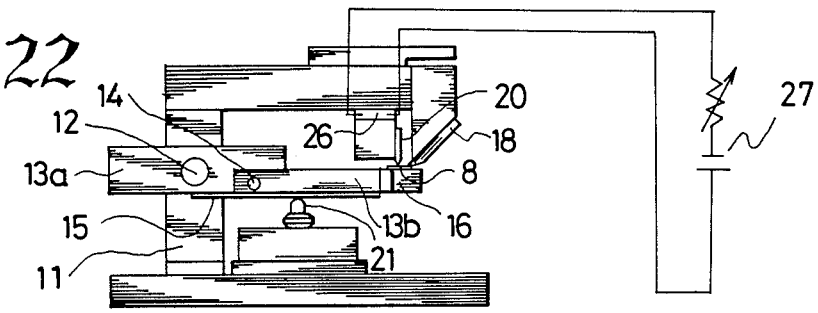
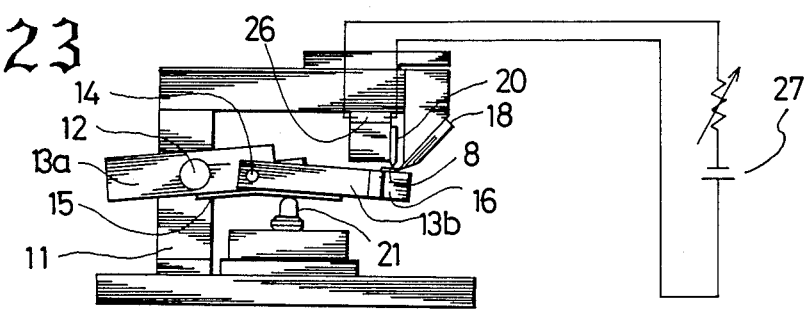
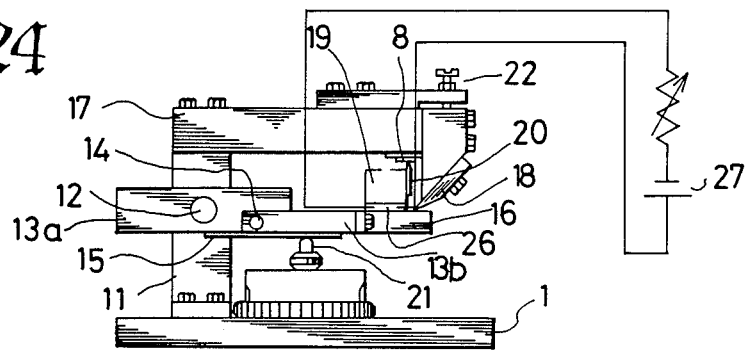

4,866,271

RELATIVE DISPLACEMENT CONTROL APPARATUS

BACKGROUND OF THE INVENTION (a) Field of the Invention

This invention relates to an apparatus which permits relative displacements between a sample and a detecting means as required, e.g., in operations of optical instruments, analyzing instruments and scanning tunneling microscopes.

(b) Description of a Prior Art

A conventional apparatus incorporated in a scanning tunneling microscope for permitting relative displacements between a sample and a probe utilizing lever action as disclosed in J. Vac. Sci. Technol. A. Vol. 4, No. 3, May/Jun 1986 entitled as "A simplified Scanning Tunneling Microscope for Surface Science Studies" is shown in FIG. 1 through FIG. 5. In such a conventional apparatus which includes base 1, sample 8, scanning tip 9, foot 7, and pivot assembly 2-6 and 10, the translational reduction of input movement to output movement is proportional to the ratio of the foot-to-probe distance Δ1 to the foot-to-pivot distance 1. In order to obtain larger translational reduction, in other words, to obtain finer control over the probe to sample distance, the whole arm assembly has to be made longer. This consequently has caused difficulties in increasing the translational reduction of such apparatus when a smaller measuring instrument wherein such apparatus is incorporated is desired.

SUMMARY OF THE INVENTION

Therefore an object of the present invention is to provide an apparatus having finer and more precise control over a detecting means to sample distance without undesirably lengthening the arm assembly.

This object has been achieved by providing a relative displacement control apparatus according to the present invention. The relative displacement control apparatus comprises a stationary means, a flexible arm means pivotally held to said stationary means, a foot mounted to the stationary means to oppose said flexible arm means and a jack means for moving said flexible arm means, wherein free end of the said flexible arm means is moved finely and precisely relative to said stationary means by motions of the jack means through combined works created by the flexible arm and the foot.

The foregoing and other objects and features of the invention will be apparent from the following description taken in connection with the accompanying illustrative embodiments in which:

BRIEF DESCRIPTION OF THE DRAWINGS

FIG. 6 shows the side view of a preferred embodiment of the invention incorporated into a tunneling scanning microscope which permits relative displacements between the sample and scanning assembly.

FIG. 7 shows the plan view of the arm assembly seen in FIG. 6.

FIG. 8 illustrates the first stage movement of the arm assembly and other related parts during which the arm assembly pivot about the pin joint means secured on the main support during the coarse approach of the arm assembly to the rigid arm.

FIG. 9 illustrates a position of the arm assembly when the contact point on the arm assembly establishes contact with the foot.

FIG. 10 illustrates the second stage movement after the contact while fine approach is performed between the scanning probe and the sample.

FIG. 11 is used to describe the translational reduction of the jack motions to the displacements between the scanning assembly and the sample.

FIG. 12 shows the side view of another preferred embodiment of the present invention.

FIG. 13 shows the side view of still another (2nd) preferred embodiment of the present invention.

FIG. 21 illustrates the first stage movement of the arm assembly and other related parts of the 3rd embodiment of the invention.

FIG. 22 illustrates a position of the arm assembly of the 3rd embodiment of the invention when a contact point on the arm assembly establishes contact with the foot.

FIG. 23 illustrates the second stage movement of the 3rd embodiment of the invention while fine approach is performed between the scanning probe and the sample after said contact has been established.

FIG. 24 shows the side view of an alternate design of the 3rd preferred embodiment of the invention.

PREFERRED EMBODIMENTS OF THE INVENTION

Figure 1:
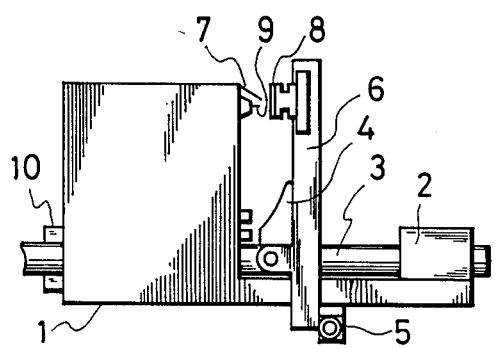
FIG. 1 shows the side view of a conventional apparatus incorporated into a tunneling scanning microscope for permitting relative displacements between the sample and scanning assembly.
Figure 2:
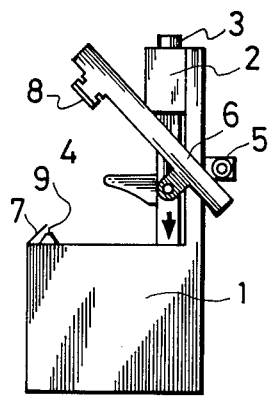
FIG. 2 illustrates initial pivotal movement of the arm assembly in approaching the sample to scanning probe, which we refer to here as the 1st stage movement.
Figure 3:
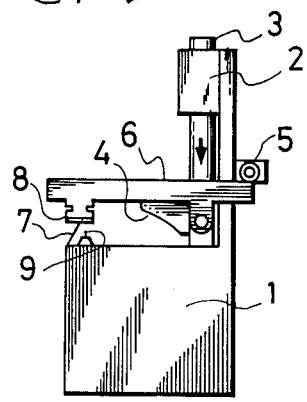
FIG. 3 illustrates movement of the arm assembly during its vertical movement, which we refer to here as the 2nd stage movement.
Figure 4:
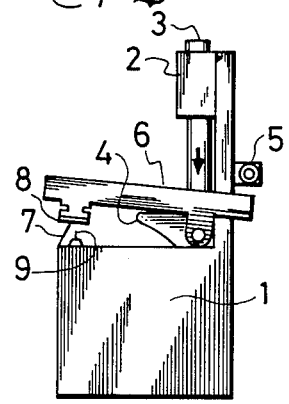
FIG. 4 illustrates movement of the arm assembly during fine approach which takes place after the contact between the sample and foot is established, which we refer to here as the 3rd manipulation stage.
Figure 5:
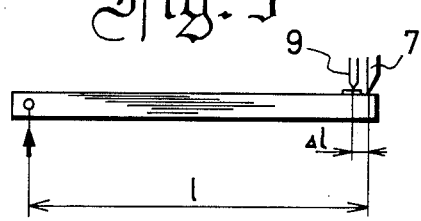
FIG. 5 is used to describe the translational reduction of the carriage motion to displacement between the sample and scanning assembly.

One of the preferred embodiments of the invention which is incorporated into a tunneling scanning microscope for permitting relative displacements between the sample and the scanning means is described in detail with reference to the abovementioned accompanying drawings. FIG. 6 and FIG. 7 show a base 1 and a main support 11 firmly secured thereto, and an arm assembly pivotally held by a pin joint means which rides on a plurality of bearings arranged in said main support. Said arm assembly consists of two arm members, the first arm member 13a and the second arm member 13b, a pivot means 14 thereby connecting said arm members and a plurality of leaf springs 15 thereby loading said two arm members. Said second arm member is free to pivot about an axis of said pivot means 14. A sample holder 16 is mounted in the proximity of the free end of the second arm, and a sample 8 is fixed to said sample holder 16. A rigid arm 17 is firmly fixed at the top of the main support 11, and a "foot" 18 is attached to a foot holder which is mounted on said rigid arm 17. Horizontally along the arm assembly and vertically, fine adjustment of said foot 18 is possible by a foot location adjusting means 22. A fine pointed scanning tip 20 is mounted on a scanning tip 3-D actuator means 19 which is firmly attached to said rigid arm at a place adjacent to said foot 18. A jack means 21 is rigidly mounted on the base 1 for applying motion to a point in said arm member 13a, which we refer to here as the first point of load. Movements of the components in this embodiment are described in FIG. 8, FIG. 9, FIG. 10 and FIG. 11. When the arm members 13a and 13b are pushed upward from their lowest position (see FIG. 8) by the jack means 5, the arm members 13a and 13b pivot about the pin joint means 12 which is mounted to the main support 11. This counterclockwise pivotal movement of the arm members 13a and 13b continues until contact between the sample 8 and foot 18 is eventually established. After the contact is established, motions of the jack means 21 applied at a point on the arm member 13a is reduced through the double-lever-action to fine displacements between the scanning tip 20 and sample 8. First, motion of the jack means is reduced by the first lever action to the ratio of "b" to "a", "b" being a distance between an axis of the pin joint 12 and an axis of the pivot means 14 which we refer to here as the first working point; "a" being a distance between the axis of the pin joint means 12 and a point whereof we refer to here as the fist point of load on the first arm member 13a whereat said jack means 21 applies motions thereto. Secondly, this reduced motion is further reduced by the second lever action of the second arm member 13b which has a point of load at the place in common with the first working point whereof we refer to here as the second point of load, pivots about the foot 18. The foot-to-scanning tip separation of Δ1 and the distance between the axis of the pivot means 14 and the foot, C, give a translational reduction of Δ1/C. Therefore, the double-lever-action gives a total translational reduction of (b/a) x (Δ1/C). In this embodiment, the measurements of each of a, b, C, and Δ1 are set at 25 mm, 10 mm, 40 mm, and 1 mm respectively. This set of measurements gives a translational reduction of 100 to 1.

Figure 14:
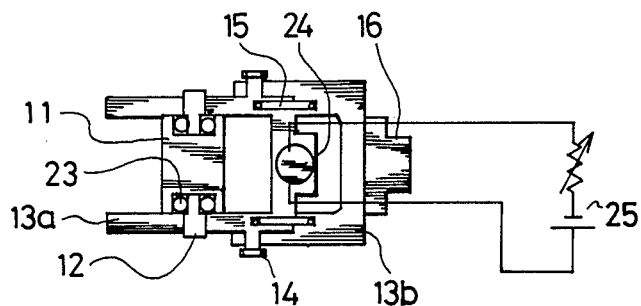
FIG. 14 Shows the plan view of the arm assembly seen in FIG. 13.
Figure 15:
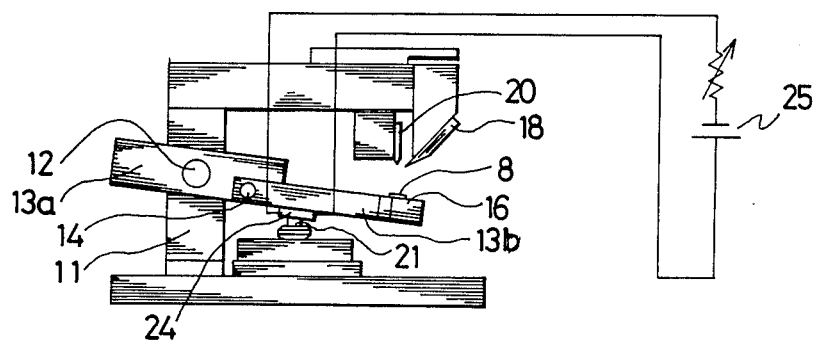
FIG. 15 illustrates the first stage movement of the arm assembly and other related parts of the 2nd embodiment of the invention.
Figure 16:
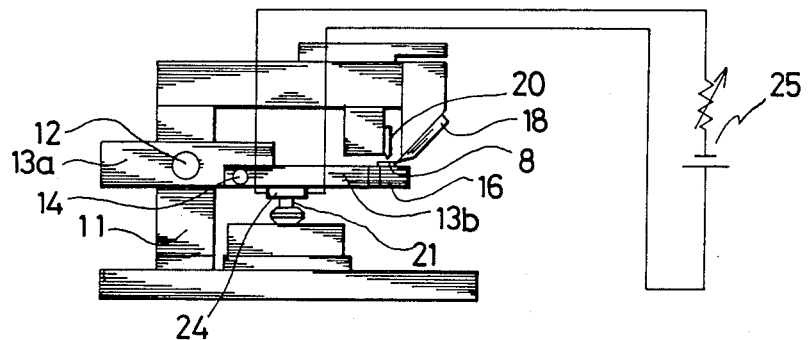
FIG. 16 illustrates a position of the arm assembly of the 2nd embodiment of the invention when the contact point on the arm assembly establishes contact with the foot.
Figure 17:
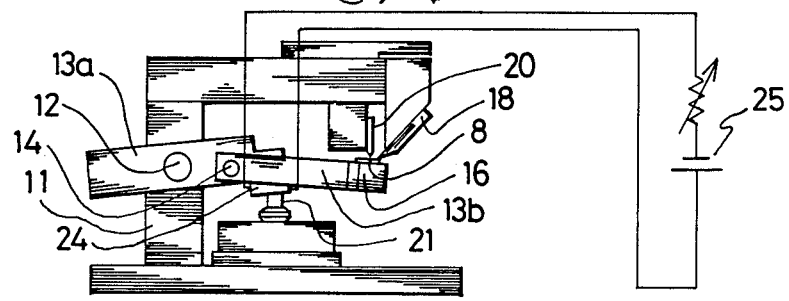
FIG. 17 illustrates the second stage movement of the second embodiment of the invention while fine approach is performed between the scanning probe and the sample after said contact has been established.
Figure 18:
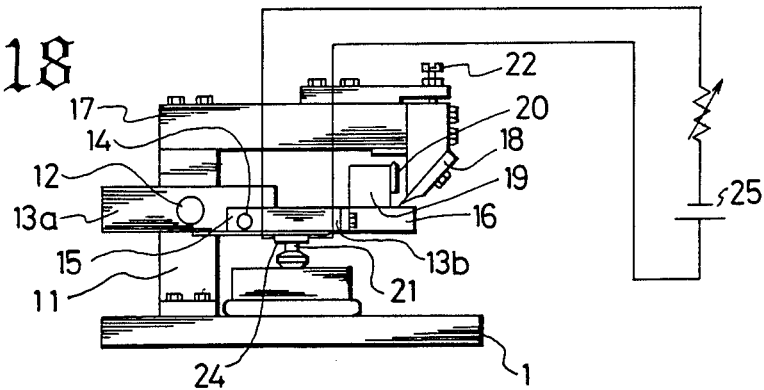
FIG. 18 shows the side view of an alternate design of the 2nd preferred embodiment of the invention.

While a conventional apparatus having the same arm length as this embodiment only gives a translational reduction of 50 to 1, this embodiment of the invention achieves double the translational reduction. An alternate design having inverted positions between the sample and scanning tip, as shown in FIG. 12, provides the same translational reduction and same precise and fine control over the scanning tip-to-sample distance. FIG. 13 and FIG. 14 show another embodiment of the present invention having a piezoelectric drive means placed atop the jack means for providing more precise vibration-free control over fine approach between the sample and scanning tip. When the fine approach is performed between the sample and scanning tip, the piezoelectric drive means placed atop the jack means is activated so as to produce extremely fine motion at the first point of load thus providing precise and minute control over the scanning tip to sample distance. FIG. 13 and FIG. 14 show a base 1 and a main support 11 firmly secured thereto and an arm assembly pivotally held by a pin joint means which rides on a plurality of bearings arranged in said main support 11. Said arm assembly consists of two arm members, the first arm member 13a and the second arm member 13b, a pivot means 14 thereby connecting said first arm member and the second arm member and a plurality of leaf springs 15 whereby said two arm members are spring-loaded. Said first and second arm members, 13a and 13b, are free to pivot about said pivot means 14. A sample holder 16 is mounted in the proximity of the free end of the second arm 13b, and a sample 8 is fixed to said sample holder 16. At a point whereat motions to said arm assembly 13 is provided by the jack means, a piezoelectric drive means 24 connected to a control power source 25 is placed atop the jack means. A rigid arm 17 is firmly fixed at the top of the main support 11, and a foot 18 is attached to a foot holder mounted on said rigid arm 17. Horizontally along the arm assembly and vertically, the foot 18 can be finely adjusted. A fine pointed scanning tip 20 is mounted on a scanning tip fine drive means 19 which is firmly attached to said rigid arm at a place adjacent to said foot 18. A jack means 21 is firmly mounted on the base 1 for providing motions to the point of load in said arm assembly 13 whereof we refer to here as the first point of load. Movements of the components in this embodiment are described in FIG. 15, FIG. 16 and FIG. 17. When the arm members 13a and 13b are pushed upward from its lowest position (see FIG. 15) by the jack means 5, said arm assembly 13 pivot about the dowel pin 12 (whereof we refer to here as the first pivot) secured to the main support 11. This counterclockwise pivotal motion of the arm members 13a and 13b continues until contact between the sample 8 and foot 18 is eventually established as shown in FIG. 16. After the contact between the sample 8 and foot 18 is established, motions of the jack means at the first point of load on the arm member 13a is reduced through the double-lever-action to fine displacements between the scanning tip 20 and sample 8 in the manner previously described with accompanying drawings FIG. 6 and FIG. 11. Motions at the first point of load during rather large pivoting of the arm, i.e. coarse approach is provided by the jack means 21. When the distance between the sample 8 and scanning tip 20 is required to be controlled finely and precisely, motions at the first point of load are produced by charging voltages to the piezoelectric drive means which is mounted on the arm member 13a and contacts with the jack means 21. In this embodiment, a multilayer piezo-actuator (multilayer PZT actuator) of 10 mm in diameter and 5mm thick is used as the piezoelectric drive means. Displacement amount of the multilayer piezo-actuator can be controlled precisely and finely in proportion to magnitudes of voltage applied thereto. Displacement of the multilayer piezo-actuator is reduced to the ratio of 100 to 1 in the case of this embodiment. An alternate design having inverted positions between the sample and scanning tip also produces the same translational reduction and fine and precise control over the sample to scanning probe.

Figure 19:
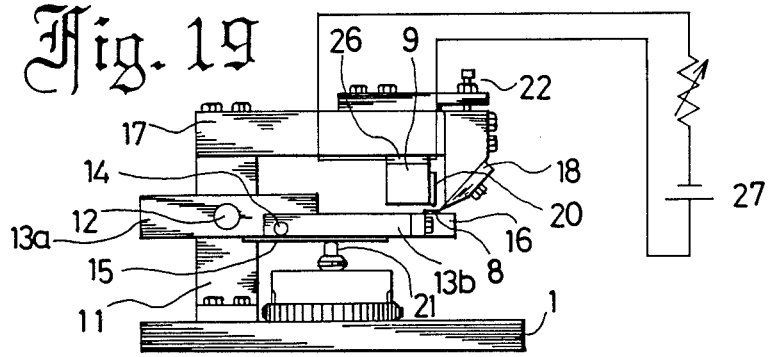
FIG. 19 shows the side view of the 3rd embodiment of the invention.
Figure 20:
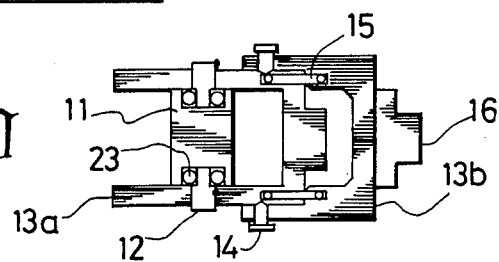
FIG. 20 shows the plan view of the arm assembly seen in FIG. 19.

Referring now to FIG. 19 and FIG. 20, there is another (3rd) embodiment of the present invention having a multilayer piezo-actuator placed between a scanning tip 3-D actuator means 19 and a rigid arm 17 for providing precise minute displacement during the fine approach between the sample and scanning tip. FIG. 19 and FIG. 20 show a base 1 and a main support 11 firmly fixed thereto and an arm assembly pivotally held by a pin joint means 12 which rides on a plurality of bearings arranged in said main support 11. Said arm assembly consists of two arm members, 13a and 13b, which are spring-loaded by a plurality of leaf springs at the joint and pivot about a pivot means 14 in one direction. A sample holder 16 is mounted in the proximity of the free end of the arm member 13b, and a sample 8 is fixed to said sample holder 16. After the coarse pivotal movement by the jack means of the arm members 13a and 13b, precise and fine approach of the sample to scanning tip in the z direction is performed by means of the multilayer piezo-actuator 26 placed between the rigid arm 17 and the scanning tip 3-D actuator means 19. The rigid arm 17 is firmly fixed atop the main support 11, and a foot 18 is attached to a foot holder mounted on said rigid arm 17. The foot 18 can be finely adjusted horizontally along the the arm assembly and vertically. A fine pointed scanning tip 20 is mounted on to the scanning tip 3-D actuator means 19 which is firmly attached to said rigid arm 17 in close vicinity of said foot 18. A jack means 21 is firmly fixed on the base 1 for applying motions to said arm assembly. Movements of the components in this embodiment are described in FIG. 21, FIG. 22 and FIG. 23. As the arm members 13a and 13b are pushed upward by the jack means 21 from their lowest position, the arm members 13a and 13b pivot counterclockwise about an axis of the pin joint means 12 mounted on the main support 11, and this pivotal movement continues until the sample 8 eventually establishes contact with the foot 18. After the contact between the sample 8 and the foot 18 is established, motions applied to the first point of load on the arm 13a is reduced through the double lever action to fine displacements between the scanning tip 20 and the sample 8 in the manner previously described with accompanying drawings FIG. 6 and FIG. 11. Motions of the arm assembly during the coarse pivotal movement, approach of the sample to the scanning tip is provided by the jack means 21. When displacements between the sample 8 and the scanning tip 20 are required to be controlled minutely and precisely, motions to be applied to the first point of load is produced by changing voltages to the multilayer piezo-actuator 26 which is placed between the rigid arm 17 and the scanning tip 3-D actuator means 19. In this embodiment, a multilayer piezo actuator of 10mm in diameter and 5 mm thick is used. An alternate design having inverted positions between the sample and the scanning tip, as shown in FIG. 24, produces the same translational reduction and same fine and precise control over the sample to scanning tip distance.

From the foregoing it is apparent that by providing an apparatus having such configurations as described hereinabove, the translational reduction of motions applied to the reduced displacement can be remarkably increased without having to extend the length of the arm assembly. During the fine approach of the sample to the scanning tip, displacements applied at the point of load in the arm assembly is controlled by a piezoelectric drive means whereby displacements can be controlled in the order of Angstroms. Further, as these displacements produced by the piezo-electric drive means are doubly reduced by means of the said double-lever-action, extremely minute and precise and vibration-free control over the relative positions between 2 points, e.g., a sample and a scanning tip becomes possible.

Having described our invention as related to the embodiments shown in the accompanying drawings, it is our intention that the invention be not limited by any of the details of description, unless otherwise specified but rather be construed broadly within its spirit and scope as set out in the accompanying claims.

What we claim is:

1. An apparatus for controlling the relative displacement of a sample and a detecting tip for detecting an electrical current from the sample, comprising: stationary means defining a stationary support; a first arm member pivotally held to said stationary means through a first pin joint member; a second arm member pivotally held at one end portion to said first arm member through a second pin joint member; jack means for jacking up and down said first arm member at one end portion thereof and spaced from said first pin joint member; foot means for stopping a movement of said second arm member at the other end portion thereof opposite said second pin joint member; an elastic support member for elastically supporting said second arm member in relation with said first arm member; a detecting tip for detecting electrical current from a sample; and a sample stage for mounting a sample; wherein the sample stage is disposed on the stationary means and the detecting tip is disposed on the other end portion of said second arm member; wherein said other end portion of said second arm member is relatively moved with respect to said stationary means by motions of said jack means for providing relative displacement between said detecting tip and a sample mounted in said sample stage.

2. The relative displacement control apparatus according to claim 1; wherein the jack means comprises at least one piezoelectric drive element.

3. The relative displacement control apparatus according to claim 1; wherein the detecting tip includes at least one piezoelectric drive element.

4. An apparatus for controlling the relative displacement of a sample and a probe, comprising:
a sample holder for holding a sample;
a probe for use with a sample;
stationary means for mounting thereon the sample holder;
means movably connected to the stationary means for mounting thereon the probe to enable coarse and fine relative displacements of the sample holder and probe, comprising a first lever arm pivotally mounted to the stationary means at a first pivot axis, a second lever arm pivotally mounted to the first lever arm at a second pivot axis spaced apart from the first pivot axis and on which the probe is mounted spaced apart from the first and second pivot axes, means elastically connecting the first and second lever arms to permit pivotal movement of the second lever arm with the first lever arm around the first pivot axis without pivotal movement about the second pivot axis to define a coarse relative displacement between the sample holder and probe and to permit pivotal movement of the second lever arm around the second pivot axis relative to the first lever arm to define a fine relative displacement between the sample holder and the probe;

actuating means engageable with the first lever arm at a distance from the pivot axes for moving the lever arms around the first and second pivot axes; and stop means mounted on the stationary means and responsive to movement of the lever arm by the actuating means for engaging the second lever arm at a point spaced apart from the first and second pivot axes for stopping the pivotal movement of the second lever arm around the first pivot axis and for effecting the pivotal movement of the second lever arm relative to the first lever arm around the second pivot axis and thereby pivotal movement of the second lever arm about said stop means.

5. The apparatus according to claim 4; wherein the actuating means comprises at least one piezoelectric drive element.

6. The apparatus according to claim 4 wherein the probe comprises at least one piezoelectric drive element.

7. An apparatus for controlling the relative displacement of a sample and a detecting tip for detecting an electrical current from the sample, comprising: stationary means defining a stationary support; a first arm member pivotally held to said stationary means through a first pin joint member; a second arm member pivotally held at one end portion to said first arm member through a second pin joint member; jack means for jacking up and down said first arm member at one end portion thereof and spaced from said first pin joint member; foot means for stopping a movement of said second arm member at the other end portion thereof opposite said second pin joint member; an elastic support member for elastically supporting said second arm member in relation with said first arm member; a detecting tip for detecting electrical current from a sample; and a sample stage for mounting a sample; wherein the detecting tip is disposed on the stationary means and the sample stage is disposed on the other end portion of said second arm member; wherein said other end portion of said second arm member is relatively moved with respect to said stationary means by motions of said jack means for providing relative displacement between said detecting tip and a sample mounted in said sample stage.

8. The relative displacement control apparatus according to claim 7; wherein the jack means comprises at least one piezoelectric drive element.

9. The relative displacement control apparatus according to claim 7; wherein the detecting tip includes at least one piezoelectric drive element.

10. An apparatus for controlling the relative displacement of a sample and a probe, comprising:

a sample holder for holding a sample;

a probe for use with a sample;

stationary means for mounting thereon the probe;

means movably connected to the stationary means for mounting thereon the sample holder to enable coarse and fine relative displacements of the sample holder and probe, comprising a first lever arm pivotally mounted to the stationary means at a first pivot axis, a second lever arm pivotally mounted to the first lever arm at a second pivot axis spaced apart from the first pivot axis and on which the sample holder is mounted spaced apart from the first and second pivot axes, means elastically connecting the first and second lever arms to permit pivotal movement of the second lever arm with the first lever arm around the first pivot axis without pivotal movement about the second pivot axis to define a coarse relative displacement between the sample holder and probe and to permit pivotal movement of the second lever arm around the second pivot axis relative to the first lever arm to define a fine relative displacement between the sample holder and the probe;

actuating means engageable with the first lever arm at a distance from the pivot axes for moving the lever arms around the first and second pivot axes; and stop means mounted on the stationary means and responsive to movement of the lever arms by the actuating means for engaging the second lever arm at a point spaced apart from the first and second pivot axes for stopping the pivotal movement of the second lever arm around the first pivot axis and for effecting the pivotal movement of the second pivot axis and thereby pivotal movement of the second lever arm about said stop means.

11. The apparatus according to claim 10; wherein the actuating means comprises at least one piezoelectric drive element.

12. The apparatus according to claim 10; wherein the probe comprises at least one piezoelectric drive element.

* * * * *